United States Patent
Moon et al.

(10) Patent No.: US 7,560,765 B2
(45) Date of Patent: Jul. 14, 2009

(54) NONVOLATILE MEMORY DEVICE AND METHOD OF FABRICATING THE SAME

(75) Inventors: Jung-ho Moon, Seoul (KR); Chul-soon Kwon, Seoul (KR); Jae-min Yu, Anyang-si (KR); Jae-hyun Park, Yongin-si (KR); Young-cheon Jeong, Yongin-si (KR); In-gu Yoon, Uiwang-si (KR)

(73) Assignee: Samsung Electronics Co., Ltd., Suwon-si ( * ) Notice: Subject to any disclaimer, the term of this patent is extended or adjusted under 35 U.S.C. 154(b) by 42 days.

(21) Appl. No.: 11/624,464

(22) Filed: Jan. 18, 2007

(65) Prior Publication Data

US 2007/0170490 A1    Jul. 26, 2007

(30) Foreign Application Priority Data

Jan. 20, 2006    (KR)    ...................... 10-2006-0006449

(51) Int. Cl.
*H01L 29/788*    (2006.01)
(52) U.S. Cl. ........................ 257/315; 257/314; 257/316; 438/266
(58) Field of Classification Search ................. 257/314, 257/315; 438/266, 719
See application file for complete search history.

(56) References Cited

U.S. PATENT DOCUMENTS

| 6,204,126 | B1 | 3/2001 | Hsieh et al. |
| 6,403,494 | B1 | 6/2002 | Chu et al. |
| 6,878,987 | B2* | 4/2005 | Lee et al. ..................... 257/315 |
| 2004/0047203 | A1* | 3/2004 | Lee et al. ..................... 365/202 |

FOREIGN PATENT DOCUMENTS

| KR | 1020010004268 | 1/2001 |
| KR | 1020040022356 A | 3/2004 |
| KR | 1020050005057 | 1/2005 |
| KR | 1020050031299 A | 4/2005 |
| KR | 1020050046063 A | 5/2005 |

* cited by examiner

*Primary Examiner*—N Drew Richards
*Assistant Examiner*—Mamadou Diallo
(74) *Attorney, Agent, or Firm*—F. Chau & Assoc., LLC

(57) ABSTRACT

A nonvolatile memory device includes a semiconductor substrate; a source region that is formed in the semiconductor substrate; a gate insulating film that is formed so as to partially overlap the source region on the semiconductor substrate; a floating gate that is formed on the gate insulating film so as to have a structure forming a uniform electric field in the portion that overlaps the source region; a control gate that is formed so as to be electrically isolated along one sidewall of the floating gate from an upper part of the floating gate, an inter-gate insulating film that is interposed between the floating gate and the control gate, and a drain region that is formed so as to be adjacent the other side of the control gate.

4 Claims, 10 Drawing Sheets

NONVOLATILE MEMORY DEVICE AND METHOD OF FABRICATING THE SAME

CROSS REFERENCE TO RELATED APPLICATION

This application claims priority from Korean Patent Application No. 10-2006-0006449, filed on Jan. 20, 2006, in the Korean Intellectual Characteristic Office, the disclosure of which is incorporated herein in its entirety by reference.

BACKGROUND OF THE INVENTION

1. Technical Field

The present disclosure relates to a nonvolatile memory device and a method of fabricating the nonvolatile memory device and, more particularly, to a nonvolatile memory device capable of a stable operation and a method of fabricating the nonvolatile memory device.

2. Discussion of Related Art

Semiconductor memory devices are storage devices that can read stored data when needed, and are generally classified into RAM (Random Access Memory) and ROM (Read Only Memory). RAM is a volatile memory device, that is, stored information are lost when power is removed, whereas ROM is a nonvolatile memory device, that is, it retains stored information even when power is removed. The nonvolatile memory device includes, for example, PROM (Programmable ROM), EPROM (Erasable PROM), EEPROM (Electrically EPROM), or a flash memory device.

Nonvolatile memory devices are further classified into a NAND type and a NOR type in accordance with the structure of a cell array. While the NAND-type memory device is suitable for a high level of integration, the NOR-type memory device has the advantage of being able to rapidly process information. As a chip size becomes reduced, however, it is necessary to form the NOR-type memory device having the high integration.

For this reason, a split gate-type nonvolatile memory device is proposed. The split gate-type nonvolatile memory device is configured such that a word line is formed along a side wall from the upper part of a floating gate. Nevertheless, even in the split gate-type nonvolatile memory device, the decrease of the integration has been continuously required due to a decrease of the design rule.

Furthermore, the conventional split gate-type nonvolatile memory device forms a source region and a drain region by injecting ions, after forming both the floating gate and the control gate. Accordingly, the interface between the control gate and the floating gate or an inter-gate insulating film is exposed during the ion injection process. That is, the memory device is damaged by the ion injection process in which a high voltage is used, and the reliability of the memory device may be decreased.

If the reliability of the memory device is deteriorated, the program and erasing operations of the nonvolatile memory device may be not normally performed.

SUMMARY OF THE INVENTION

Exemplary embodiments of the present invention provide a nonvolatile memory device capable of a stable operation.

Other exemplary embodiments of the present invention provide a nonvolatile memory of device capable of a stable operation.

According to an exemplary embodiment of the present invention, a nonvolatile memory device includes a semiconductor substrate, a source region that is formed in the semiconductor substrate, a gate insulating film that is formed so as to partially overlap the source region on the semiconductor substrate, a floating gate that is formed on the gate insulating film so as to have a structure forming a uniform electric field in the portion that overlaps the source region, a control gate that is formed so as to be electrically isolated along one sidewall of the floating gate from an upper part of the floating gate, an inter-gate insulating film that is interposed between the floating gate and the control gate, and a drain region that is formed so as to be adjacent the other side of the control gate.

According to an exemplary embodiment of the present invention, a nonvolatile memory device includes a semiconductor substrate, a common source region that is formed in the semiconductor substrate, first and second gate insulating films that are formed on both sides of the common source region so as to partially overlap the common source region, first and second floating gates that are formed on the first and second gate insulating films, respectively, such that the curvatures of the other side thereof are larger than those of one side adjacent to the common source region, first and second control gates formed so as to be electrically isolated along the other sidewall of the floating gate from an upper part of the first and second floating gates toward a direction opposite to the common source region, respectively, first and second inter-gate insulating films that are formed on the first and second floating gates and interposed between the first and second floating gates and the first and second control gates, and first and second drain regions that are formed so as to be adjacent to the other side of the first and second control gates, respectively.

According to an exemplary embodiment of the present invention, a method of fabricating a nonvolatile memory device includes forming a poly-silicon pattern, in which a first opening is formed so as to extend in one direction, on a semiconductor substrate, forming a common source region in the semiconductor substrate by a first ion injection process using the poly-silicon pattern as a mask, forming a blocking film on the poly-silicon pattern so as to bury the first opening, forming a second opening that exposes a portion of an upper surface of the poly-silicon pattern and the blocking film buried in the first opening by etching a portion of the blocking film, forming first and second inter-gate insulating films on the poly-silicon pattern divided into both sides by the blocking film buried in the first opening so as to be exposed y the second opening, removing the blocking film, forming first and second floating gates by etching the poly-silicon pattern by using the first and second inter-gate insulating films as an etching mask, forming first and second control gates on the first and second floating gates, and forming first and second drain regions at the other side of the first and second control gates.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1A:
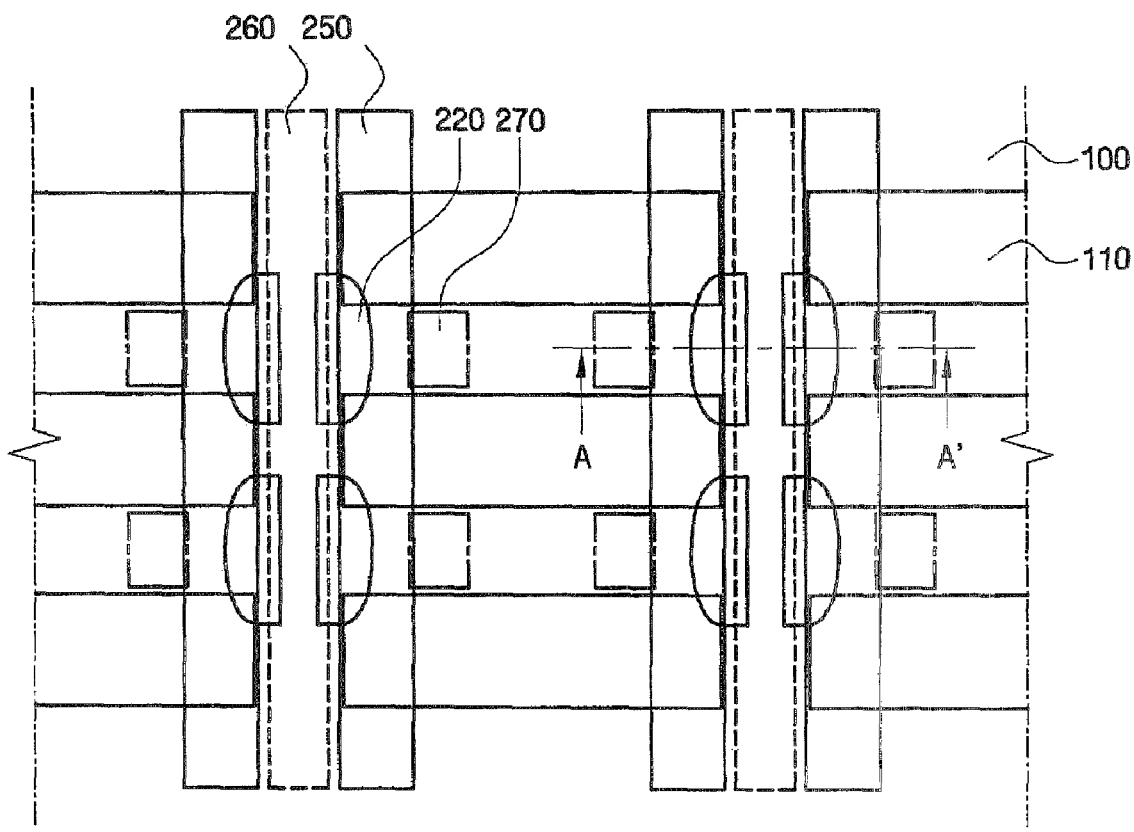
FIG. 1A is a layout view of a nonvolatile memory device according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, and the present invention will only be defined by the appended claims. In the exemplary embodiments of the present invention, a detailed description of known device structures and techniques incorporated herein will be omitted when it may make the subject matter of the present invention unclear.

Hereinafter, like reference numerals refer to like elements throughout the specification.

Hereinafter, the structure and operation of a nonvolatile memory device according to an exemplary embodiment will be described with reference to FIGS. 1A to 4.

Initially, the structure of the nonvolatile memory device according to an exemplary embodiment of the invention will described with reference to FIGS. 1A and 1B.

Figure 1B:
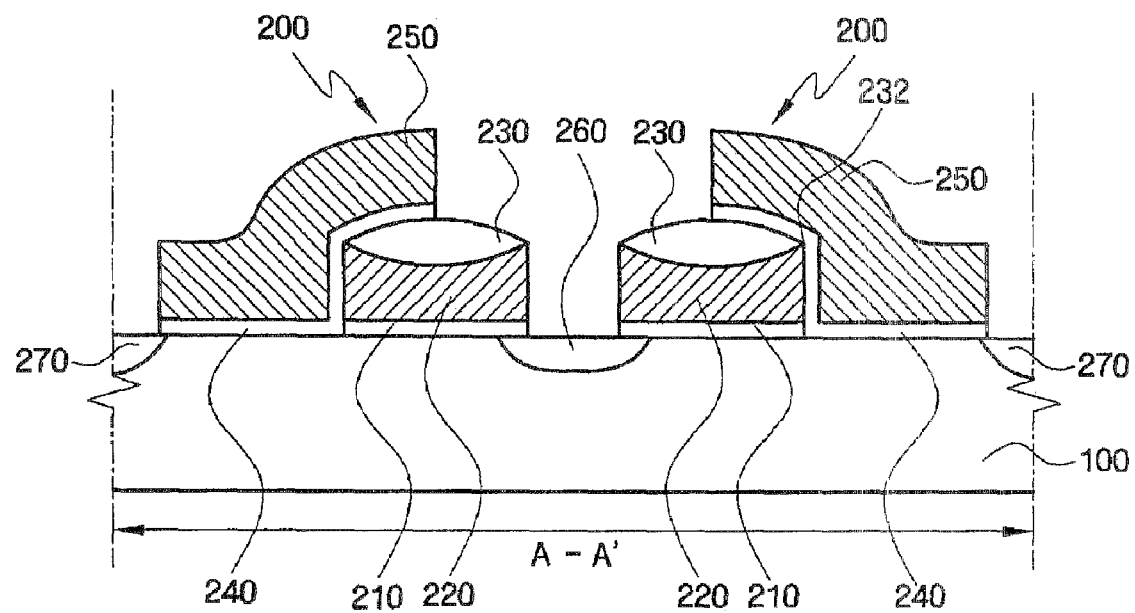
FIG. 1B is a cross sectional view taken along a line A-A' of FIG. 1A.

FIG. 1A is a layout view of a nonvolatile memory device according to an exemplary embodiment of the present invention. FIG. 1B is a cross sectional view taken along a line A-A' of FIG. 1A.

The nonvolatile memory device according to an exemplary embodiment of the present invention includes a floating gate 220, a control gate 250, a common source region 260, and a drain region 270.

A semiconductor substrate 100 may be, for example, a silicon substrate, a SOI (Silicon On Insulator) substrate, a gallium-arsenic (GaAs) substrate, a silicon-germanium (SiGe) substrate, a ceramic substrate, a quartz substrate, or a display glass substrate. Furthermore, a P-type substrate is mainly used as the semiconductor substrate 100, and even though not shown in the drawings, the semiconductor substrate 100 may have a dual-layer structure of which a P-type epitaxial layer is grown thereon.

A device isolation region 110 formed on the semiconductor substrate 100 defines an active region.

The common source region 260 is formed in the active region of the semiconductor substrate 100, and the floating gate 220 is formed at one side of the common source region 260, so as to partially overlap the common source region 260. The floating gate 220 is made of a poly-silicon. More specifically, a poly-silicon is used in which impurities are ion-injected, or a conductive material such as a metallic conductive film.

The floating gate 220 is formed so as to partially overlap the common source region 260, and has a structure forming a uniform electric field in the overlap portion between the floating gate 220 and the common source region 260. That is, in order to form the uniform electric field in the overlap portion between the floating gate 220 and the common source region 260, the overlap portion between the floating gate 220 and the common source region 260 may be initially formed so as to have a uniform width. Secondly, the overlap portion between the floating gate 220 and the common source region 260 may be formed such that the curvature on the other side thereof is larger than that of the one side of the floating gate 220 adjacent the common source region 260. In this exemplary embodiment, the curvature of one side adjacent the common source region 260 may be zero, that is, may have a right angle shape.

A gate insulating film 210 is formed between the substrate 100 and the floating gate 220, and allows the floating gate 220 and the substrate 100 to be electrically isolated from each other.

The gate insulating film 210 serves the function of coupling the common source region 260 and the floating gate 220 during the program operation. Accordingly, the materials having a high dielectric constant k may be used as the gate insulating film 210 so as to improve the efficiency of the program operation. A nitride, an oxynitride, a high-k material, and a combination thereof ay be used as the gate insulating film 210, for example. The high-k material used as the gate insulating film 210 may be an oxide such as Al, Zr, Hf, and La, an oxynitride, or a combination thereof. After depositing a single thin film, such as MTO, or a multilayer thin film, such as a thermal oxidation film/MTO or a thermal oxidation film/SiON/MTO, the insulating film treated by $N_2O$-annealing is used as the gate insulating film 210.

In addition, an ONO (oxide-nitride-oxide) stacked film, of which the oxide film, the nitride film, and the oxide film are stacked, may be used in the gate insulating film 210. In this case, since electrons can be injected into the nitride film used as the gate insulating film 210, it is possible to operate the cell as a multi-level device, thereby increasing the memory integration.

An inter-gate insulating film 230 is formed on the floating gate 220, and a tip 232 may be formed at the side wall of the floating gate 220 that contacts with the inter-gate insulating film 230. The tip 232 enveloping a portion of the floating gate 220 has a sharp or pointed shape. Owing to the structural characteristic of the tip 232, the electric field is concentrated at the sharp portion, and the F-N tunneling (Fowler-Nordheim tunneling) is induced through the sharp portion at a low voltage during the erasing operation of the nonvolatile memory device 200.

The inter-gate insulating film 230 may be formed of a thermal oxidation film, and the thickness of the inter-gate insulating film 230 gradually becomes thinner from the center to both ends. The thickness of the center is about 200 to 1500 Å.

The control gate 250 is formed so as to extend from the upper part of the floating gate 220 toward the substrate 100 along the side wall of the floating gate 220 and to be electrically isolated from the floating gate 220 and the substrate 100. Since a tunneling insulating film 240 is formed between the control gate 250 and the floating gate 220, the control gate 250 and the floating gate 220 may be electrically isolated from each other by the tunneling insulating film 240. That is, since the tunneling insulating film 240 is interposed between the control gate 250 and the floating gate 220, the electrons stored in the floating gate 220 are discharged into the control gate 250 by passing through the tunnel insulating film 240 by the F-N tunneling during the erasing operation of the nonvolatile memory device 200.

The control gate 250 serves the function of transmitting the data of the bit lines (BLn) to the memory cells and transmitting the data of the memory cells to the bit lines during the program and read operations of the nonvolatile memory device 200. In addition, the control gate 250 serves as an erase gate during the erasing operation of the nonvolatile memory device 200.

A drain region 270 is formed at the other side of the control gate 250 that is disposed on the substrate 100.

The nonvolatile memory device according to an exemplary embodiment of the present invention is formed such that two memory deices 200 are symmetrical to each other around the common source region 260. That is, two memory devices 200 share one common source region 260. Accordingly, it is possible to reduce the overall size of the nonvolatile memory device.

Hereinafter, the effects of the nonvolatile memory device according to an exemplary embodiment of the present invention will be described with reference to FIG. 2, as compared to the related art.

Figure 2:
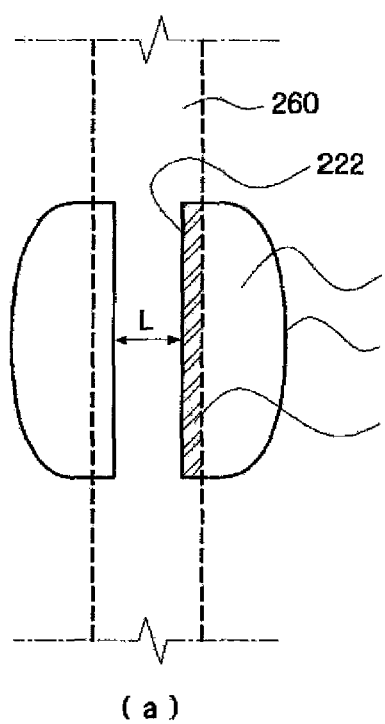
FIG. 2 is a view illustrating the effects of a nonvolatile memory device according to an exemplary embodiment of the present invention.
Figure 2:
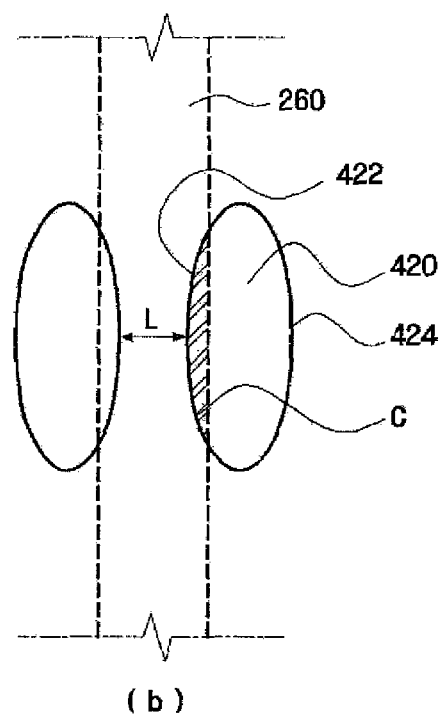

FIG. 2 is a view illustrating the effects of the nonvolatile memory device according to an exemplary embodiment of the present invention. In FIG. 2, (a) is a view showing the floating gate of the nonvolatile memory device according to an exemplary embodiment of the present invention, and (b) is a view showing the floating gate of a conventional nonvolatile memory device.

Sides of floating gates 220 and 420 adjacent the common source region 260 are regarded as first sides 222 and 422, respectively, and the other sides thereof are regarded as second sides 224 and 424, respectively. The width of the overlap portion between the floating gate 220 and 420 and the common source region 260 represents the width in a direction that is vertical to one direction toward which the common source region 260 is extended.

Referring to (a) of FIG. 2, the floating gate 220 is formed such that a curvature of the second side 224 is larger than that of the first side 222. In this exemplary embodiment, the curvature of the first side 222 may be zero. Accordingly, the width of the overlap portion B between the floating gate 220 and the common source region 260 may be uniform. Alternatively, even though the width of the overlap portion B between the floating gate 220 and the common source region 260 is not uniform, it may be similarly formed within a predetermined error range. Accordingly, since the electric field between the floating gate 220 and the common source region 260 is generated by the same area and conditions, a uniform electric field may be formed in any part of the overlap portion B.

Referring to (b) of FIG. 2 each of the edges of the floating gate 420 has a rounded shape. Generally, the rounded shape may be easily formed when forming the floating gate 420 by an etching process. In this case, all of the curvatures of the first side 422 and the second side 424 are relatively large. Accordingly, since the width of the overlap portion C between the floating gate 420 and the common source region 260 is not uniform, the electric field of the overlap portion between the floating gate 420 and the common source region 260 is not uniformly maintained.

In addition, if the curvature of the overlap portion between the floating gate 220 and the common source region 260 is getting smaller, the area of the overlap portion between the floating gate 220 and the common source region 260 may become wider as compared to the area when the curvature is large. The distance between two elements of the floating gates 220 and 420 is maintained above a predetermined distance. Accordingly, as shown at (a) and (b) in FIG. 2, in the case where the shortest distance L between the respective two floating gates 220 and 420 is the same, it is understood that the area of the portion B is larger than that of the portion C.

If the area of the overlap portion between the floating gate 220 and the common source region 260 becomes wider, the value of the capacitance generated between the floating gate 220 and the common source region 260 increases, whereby a coupling ratio increases. As a result, it is possible to allow the program and the erasing operations to stabilize, which will be described more fully below.

Hereinafter, the operation of the nonvolatile memory device according to an exemplary embodiment of the present invention will be described with reference to FIGS. 3 and 4.

Figure 3:
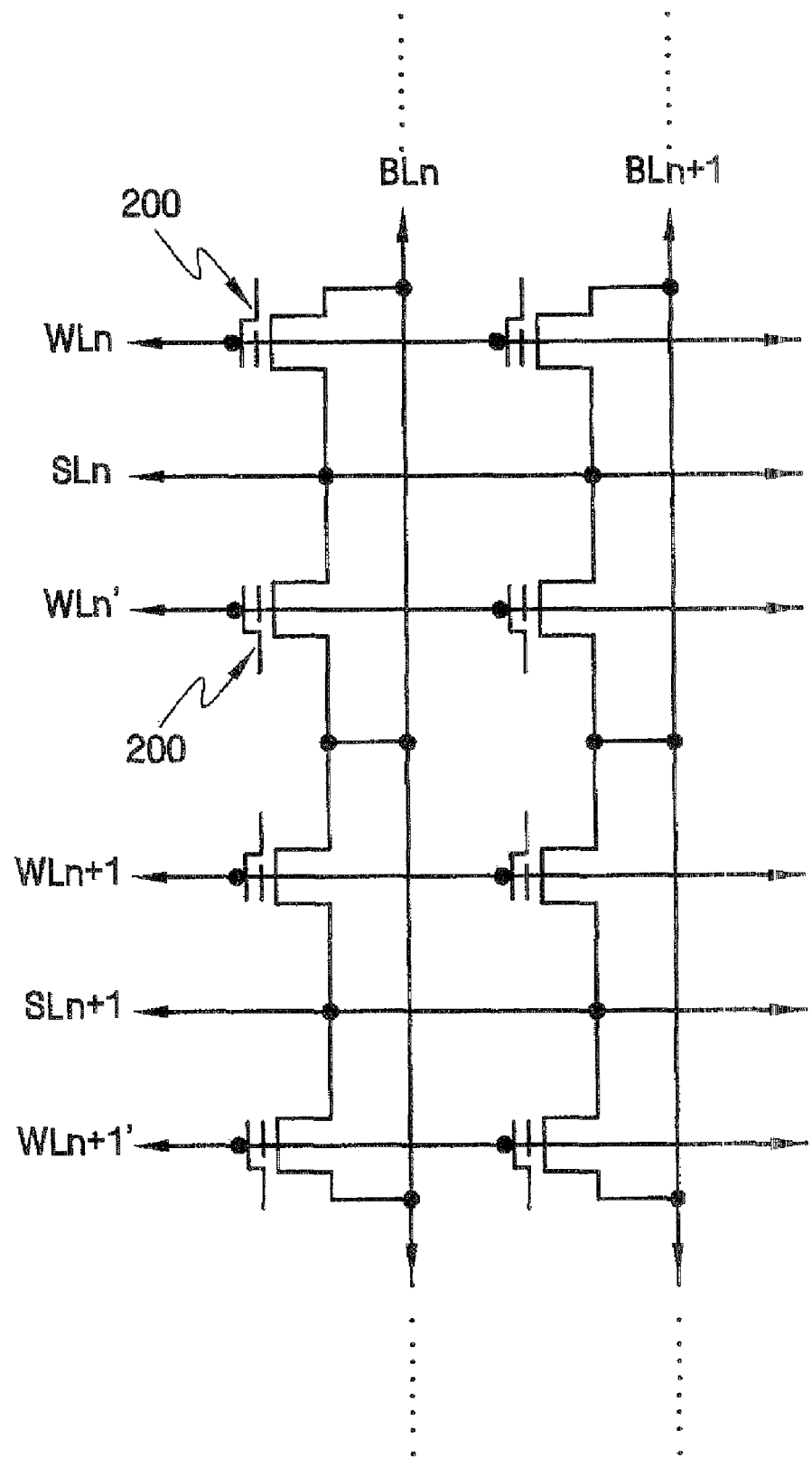
FIG. 3 is an equivalent circuit diagram of a nonvolatile memory device according to an exemplary embodiment of the present invention.

FIG. 3 is an equivalent circuit diagram of a nonvolatile memory device according to an exemplary embodiment of the present invention. FIG. 4 is a view illustrating an operation of a nonvolatile memory device according to an exemplary embodiment of the present invention.

Figure 4:
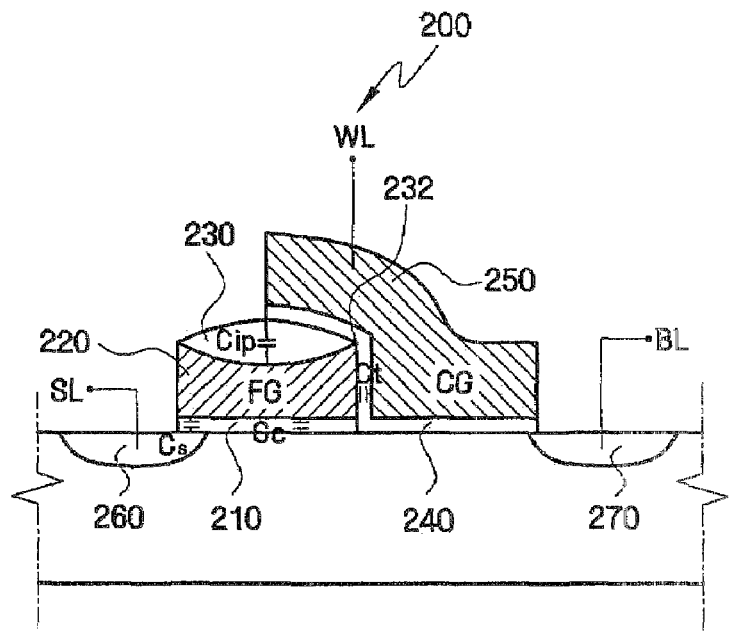
FIG. 4 is a view illustrating an operation of a nonvolatile memory device according to an exemplary embodiment of the present invention.

Referring to FIGS. 3 and 4, the two nonvolatile memory devices 200 according to an exemplary embodiment of the present invention are disposed in pairs. A pair of the nonvolatile memory devices 200 shares a source line SLn. Furthermore, a word line WLn is connected to the control gate 250, and bit lines BLn are connected to the drain regions of the nonvolatile memory devices 200, respectively.

During the program operation, a high voltage of about 10 V is applied to the source line SLn, and a voltage of 1 V or less is applied to the bit line BLn or it is grounded. The voltage that is a little higher than a threshold voltage is applied to the word line WLn. In this case, the voltage applied to the word lie WLn is about 1.8 V serving as the turn-on voltage of the gate, so as to reduce the current flowing during the program operation. The high voltage of the gate, so as to reduce the current flowing during the program operation. The high voltage applied to the source line SLn is coupled and transmitted to the floating gate 220 through the gate insulating film 210, and the voltage transmitted to the floating gate 220 forms an inverse layer on the substrate surface disposed at the lateral part and the lower art of the floating gate 20. Furthermore, the voltage applied to the word line WLn forms the inverse layer on the surface of the substrate 100 below the control gate 250. Accordingly, when the electrons are shifted from the drain region 270 to the common source region 260, the electrons are accumulated on the floating gate 220 by passing through the gate insulating film 210 by means of the hot electron injection process.

A zero electric potential is applied to the source line SLn and the bit line BLn during the erasing operation, and the high voltage of 11 V or more is applied to the word line WLn. For this reason, the electrons accumulated on the floating gate 220 are attracted by the high voltage of the word line WLn, pass through the tunneling insulating film 240 by the F-N tunneling, and shift into the control gate 250.

In order to reduce the voltage of the control gate 250 generating the tunneling, the tip 232 at one sidewall of the floating gate 220 is formed adjacent the control gate 250. Since the electric filed is concentrated on the sharp-shaped tip 232 of the floating gate 220, the electrons accumulated on the floating gate 220 during the erasing operation are shifted into the control gate 250 through the tunneling insulating film 240 near to the tip 232 by the relatively low voltage.

During the read operation, a voltage of about 1 to 2 V is applied to the word line WLn, the ground voltage is applied to the source line SLn, and a voltage of about 0.4 to 1 V is applied to the bit line BLn. Alternatively, on the contrary, a voltage of about 1 to 2 V is applied to the word line WLn, a voltage of about 0.4 to 1 V is applied to the source line SLn, and the ground voltage is applied to the bit line BLn. Accordingly, if the electrons are accumulated on the floating gate 220, the channel is not formed between the drain region 270 and the common source region 260, and the current does not flow. Meanwhile, if the electrons are not accumulated on the floating gate 220, the channel is formed between the drain region 270 ad the common source region 260, and the current flows. As above described, it is possible to sense whether the electrons are accumulated on the floating gate 220 or not by detecting a current that flows between the drain region 270 and the common source region 260. In other words, the stored data is read out.

Hereinafter, the program and the erasing operations of the nonvolatile memory device according to an exemplary embodiment of the present invention will be described in more detail.

In order to understand the characteristic difference of the program and the erasing operations of the nonvolatile memory device 200 according to an exemplary embodiment of the present invention, the capacitance of the nonvolatile memory device is schematically shown in FIG. 4. The total capacitance Ctotal of the cell may be represented as "Ctotal=Ct+Cc+Cs+Cip". In this exemplary embodiment, Ct is the capacitance of the tunneling insulating film 240 interposed between the floating gate 220 and the control gate 250, and Cc is the capacitance of the gate insulating film 210 interposed between the floating gate 220 and the substrate 100. In addition, Cs is the capacitance of the gate insulating film 210 interposed between the floating gate 220 and the source region 260, and Cip is the capacitance of the inter-gate insulating film 230 interposed between the floating gate 220 and the control gate 250.

A coupling ratio r (rho in the following equation) of the nonvolatile memory device 200 according to an exemplary embodiment of the present invention is as follows:

$$\gamma = \frac{C_s + C_c}{C_{total}} V_s + \frac{C_{ip} + C_t}{C_{total}} V_c$$

Here, Vs is the voltage applied to the source region 260, and Vc is the voltage applied to the control gate 250.

During the program operation, since the voltage Vs applied to the source region 260 is much higher than the voltage Vc applied to the control gate 250, that is, Vs>>Vc, the coupling ration r during the program operation is (Cs+Cc)/Ctotal.

The nonvolatile memory device 200 according to an exemplary embodiment of the present invention performs the program operation by the coupling of the floating gate 220 and the source region 260. Accordingly, as the coupling ratio r increases, the program operation is properly performed. That is, as the value of Cs and/or Cc is larger, the program operation is properly performed. It is noted that the capacitance is proportional to the area of the upper electrode and the lower electrode.

Since Cs is the capacitance of the gate insulating film 210 interposed between the floating gate 220 and the source region 260, the floating gate of the overlap portion between the floating gate 220 and the source region 260 becomes the upper electrode. Accordingly, as the area of the overlap portion between the floating gate 220 and the source region 260 increases, the value of Cs increases. The nonvolatile memory device according to an exemplary embodiment of the present invention may form the area of the overlap portion between the floating gate 220 and the common source region 260 as widely as possible by reducing the curvature of the overlap portion between the floating gate 220 and the common source region 260. Accordingly, the capacitance, that is, Cs, generated between the floating gate 220 and the source region 260 increases, thereby increasing the coupling ratio. By this feature, the characteristic of the program operation may be greatly improved.

During the erasing operation, since the voltage Vc applied to the control gate 250 is much higher than the voltage Vs applied to the source region 260, that is, Vc>>Vs, the coupling ratio r during the erasing operation becomes (Cip+Ct)/Ctotal. The nonvolatile memory device according to an exemplary embodiment of the present invention performs the erasing operation by the F-N tunneling of which the electrons stored in the floating gate 220 are discharged into the control gate 250. At this time, in order to effectively perform the erasing operation, the voltage difference between the floating gate 220 and the control gate 250 should be large. That is, as the coupling ratio r is made smaller, the erasing operation is performed well. In the nonvolatile memory device 200 according to an exemplary embodiment of the present invention, as the value of Cs increases, the value of Ctotal increases. Accordingly, as the coupling ratio r is made smaller, the erasing operation is performed well.

Hereinafter, a method of fabricating a semiconductor integrated circuit device according to an exemplary embodiment of the present invention will be described with reference to FIGS. 1A, 1B, and 5A to 12B. FIGS. 5A to 12B are views illustrating a method of fabricating a semiconductor integrated circuit device according to an exemplary embodiment of the present invention.

Figure 5A:
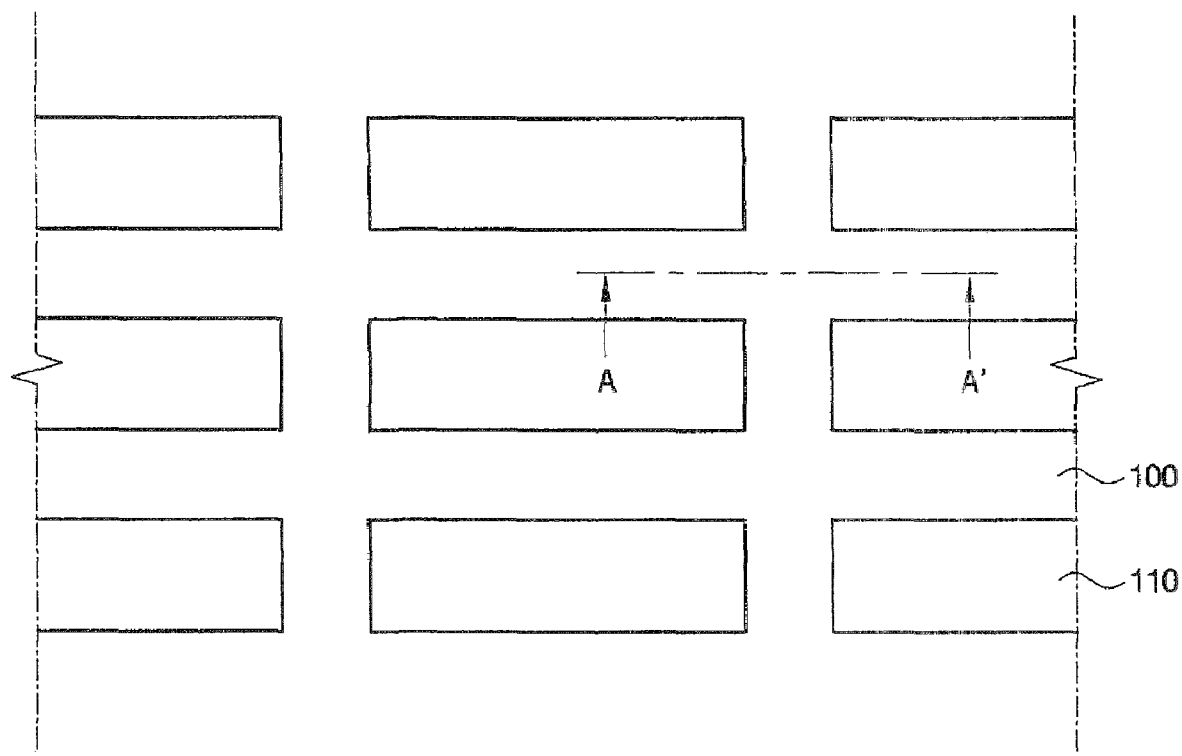
FIGS. 5A to 12B are views illustrating a method of fabricating a nonvolatile memory device according to an exemplary embodiment of the present invention.
Figure 5B:
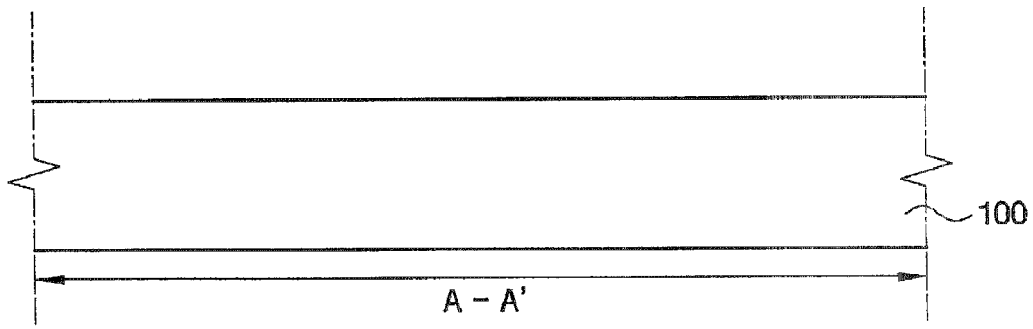

Referring to FIGS. 5A and 5B, an active region is defined by forming a device isolation region 110 on the substrate 100. The device isolation region 110 may be FOX (Field Oxide) or STI (Shallow Trench Isolation) using LOCOS (Local Oxidation of Silicon) method.

Figure 6A:
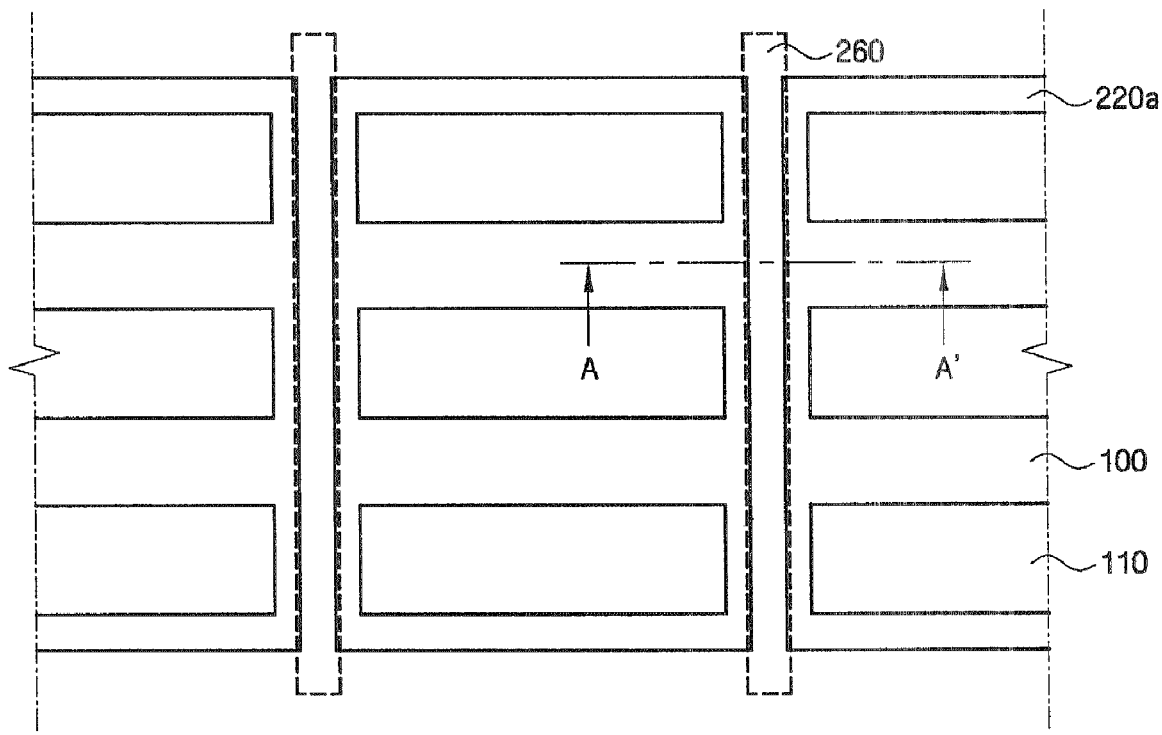
Figure 6B:
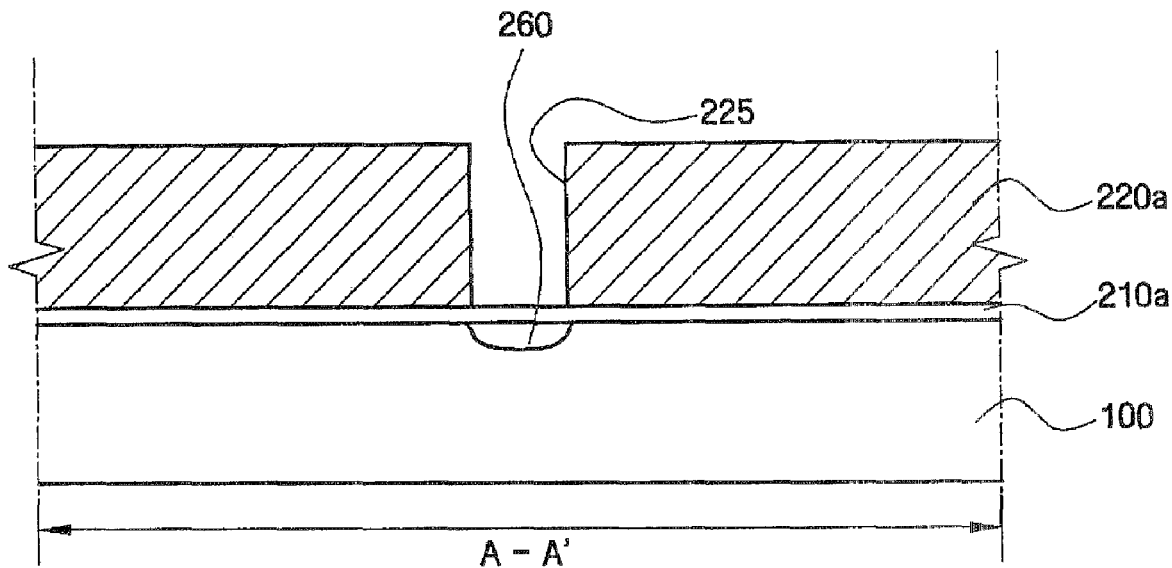

Next, referring FIGS. 6A and 6B, an insulating film 210a and a poly-silicon pattern 220a are formed on the active region.

The insulating film 210a may be formed of, for example, a thermal oxidation film, and formed to have a thickness of about 3 to 150 Å.

The poly-silicon pattern 220a is formed by etching a portion of a poly-silicon layer by using the insulating film 210a as an etch stop mask, after depositing the poly-silicon layer having a thickness of about 500 to 2000 Å on the insulating film 210a. At this time, a first opening 225 extending in one direction is formed in the poly-silicon pattern 220a.

Figure 7:
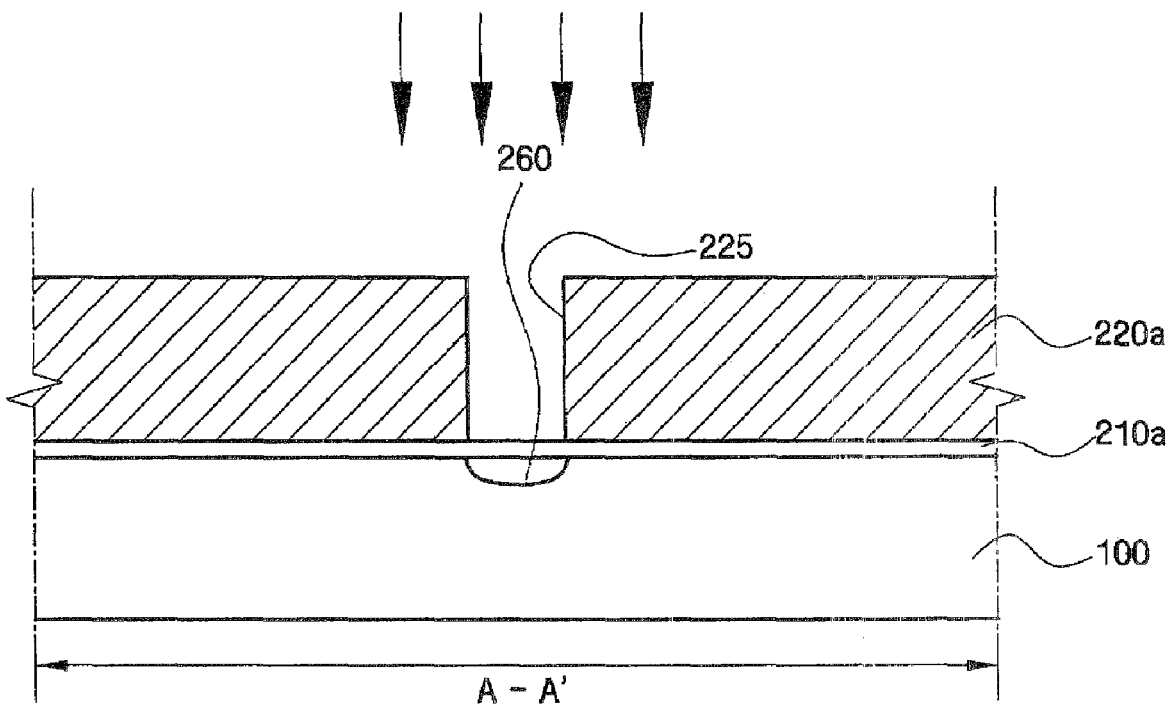

Next, referring to FIGS. 6A and 7, a common source region 260 is formed in the semiconductor substrate 100 by using the poly-silicon pattern 220a as a mask through a first ion injection process of injecting ions into the first opening 225. In this exemplary embodiment, in the case where the nonvolatile memory device to be formed is an N-type transistor, the common source region 260 is formed by injecting an N-type impurity. The N-type impurity includes, for example, phosphorus (P) or arsenic (As). On the other hand, in the case where the nonvolatile memory device to be formed is a P-type transistor, the common source region 260 is formed by injecting a P-type impurity. The P-type impurity includes, for example, boron (B), boron fluoride ($BF_2$, $BF_3$), or indium (In).

As described above, if the first ion injection process for forming the common source region 260 is performed at the initial step of the method of fabricating the nonvolatile memory device, it is possible to prevent the characteristics and the reliability of cells from deteriorating owing to the damage of the nonvolatile memory device caused by the ion injection process that is performed by a high voltage.

Figure 8:
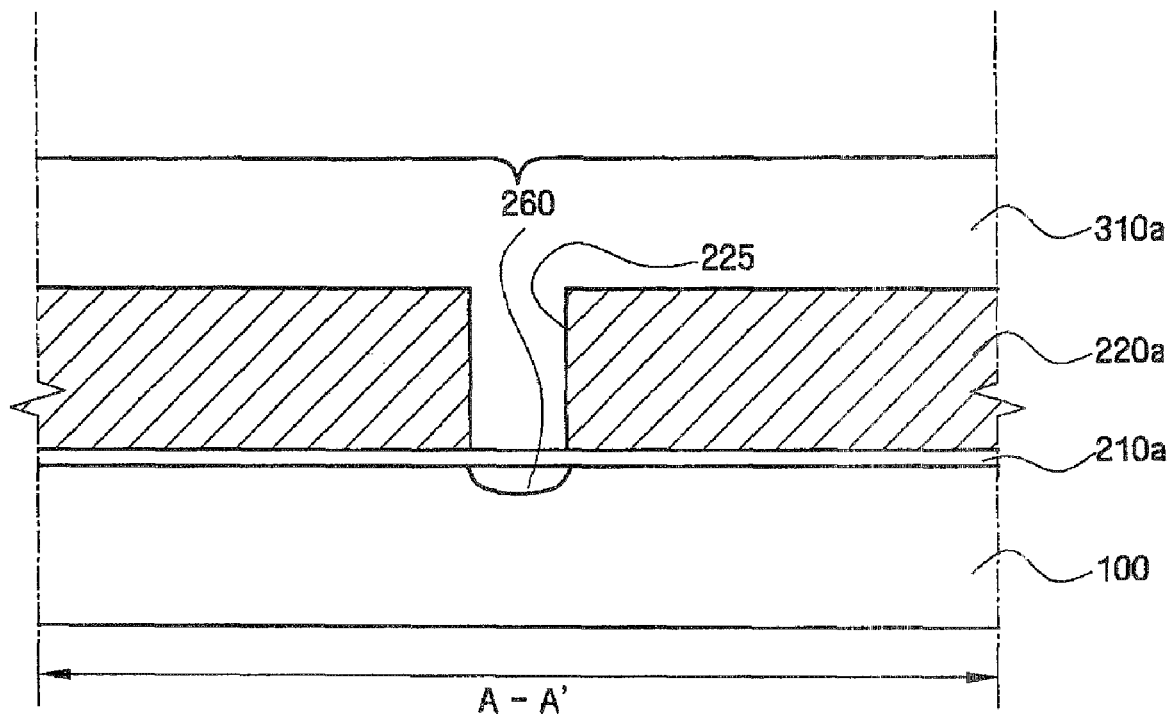

Referring to FIGS. 6A and 8, a blocking film 310a is formed on the poly-silicon pattern 220a. The blocking film 310a includes a nitride film, and the like. At this time, the blocking film 310a is formed on the poly-silicon pattern 220a so as to bury the first opening 225.

Figure 9A:
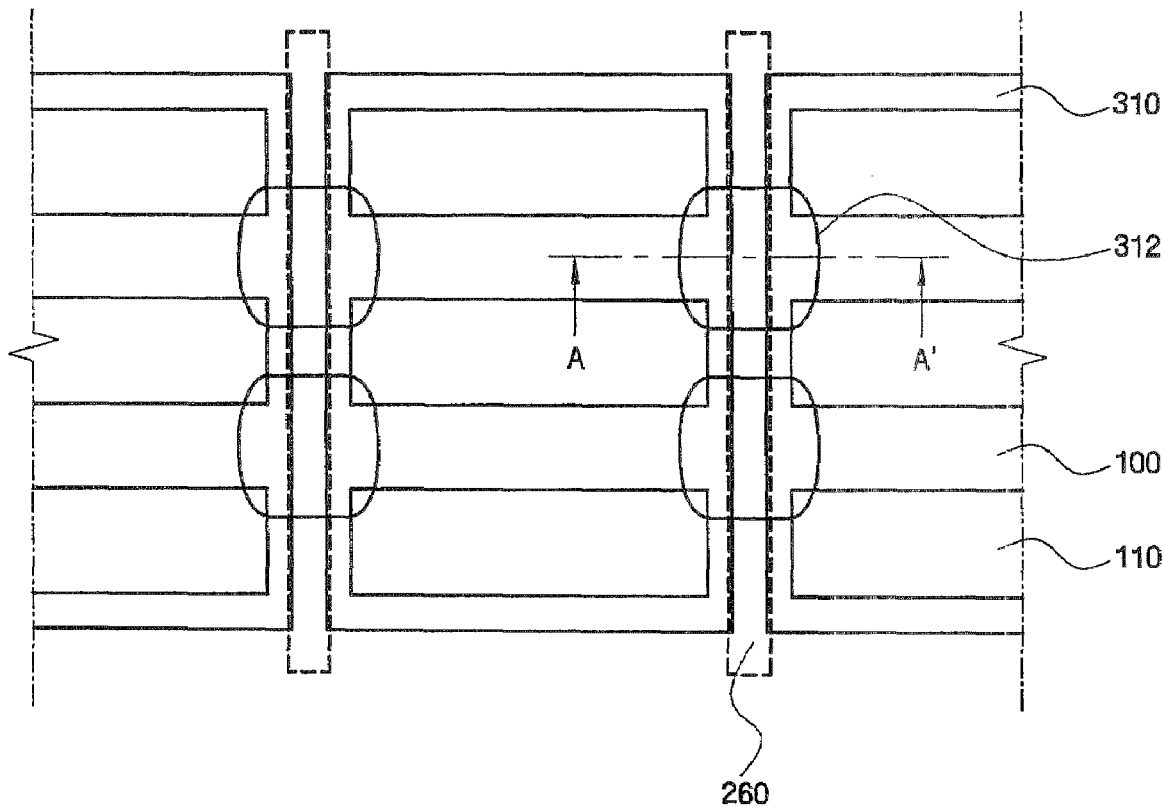
Figure 9B:
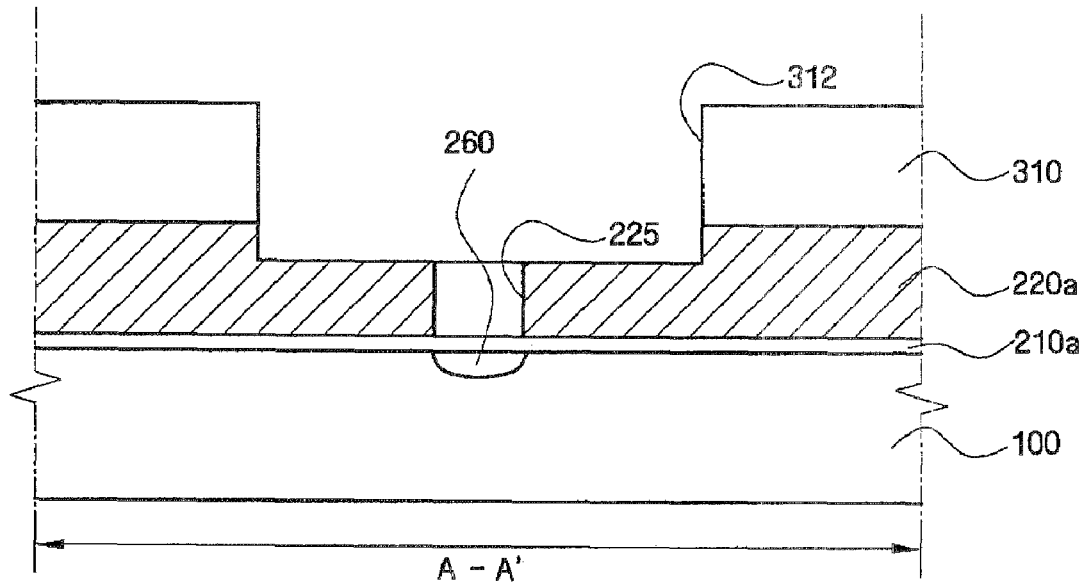

As shown in FIGS. 9A and 9B, a second opening 312 that exposes a portion of the upper part of the poly-silicon pattern 220a and the blocking film 310 buried in the first opening 225 is formed by etching a portion of the blocking film 310. At this time, the first opening 312 may be formed such that the blocking film 310 buried in the first opening 225 is positioned at a center of the second opening 312. In addition, the second opening 312 may be formed by over-etching the blocking film 310 burying the first opening 225 and a portion of the poly-silicon pattern 220a. For example, in a case where the height of the poly-silicon pattern 220a is about 700 to 1200 Å, it is possible to over-etch to the extent of about 50 to 200 Å.

Next, a second ion injection process may be performed. The second ion injection process may be performed at a portion of the upper part of the poly-silicon pattern 220a exposed by the second opening 312. The second ion injection process allows ions to be doped into the semiconductor substrate 100 so as to control the threshold voltage of the memory device. Alternatively, in the subsequent process, the second ion injection process allows ions to be doped on the poly-silicon pattern 220a so as to easily form the inter-gate insulating film on the poly-silicon pattern 220a.

Figure 10:
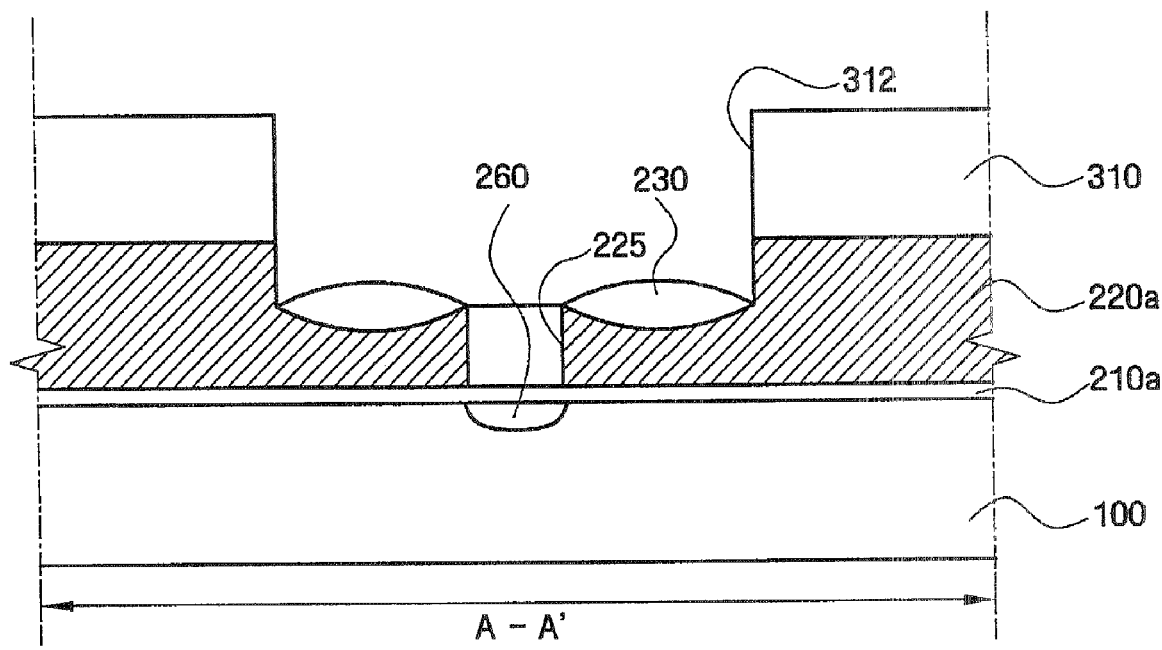

As shown in FIGS. 9A and 10, an inter-gate insulating film 230 is formed on the poly-silicon pattern 220a divided into both sides by the blocking film 310 buried in the first opening 225 so as to be exposed by the second opening 312. The inter-gate insulating film 230 is formed by growing an oxidation film on the poly-silicon pattern 220a through the thermal oxidation process, and formed such that the thickness of the inter-gate insulating film becomes thinner as it goes toward both ends from the center thereof.

The inter-gate insulating film 230 serves as an etch stop film in the subsequent etching process. In order to form the inter-gate insulating film 230, the upper part of the poly-silicon pattern 220a is treated by thermal oxidation. In this case, while the lower edge of the inter-gate insulating film 230 may be formed with a rounded shape, the upper surface of the poly-silicon pattern 220a may be formed with the tip 232 shown in FIG. 4. As described above, since the tip 232 serves the function of reducing the magnitude of the tunneling voltage for the erasing operation, the forming process of the tip 232 may be excluded depending to the process conditions.

Figure 11:
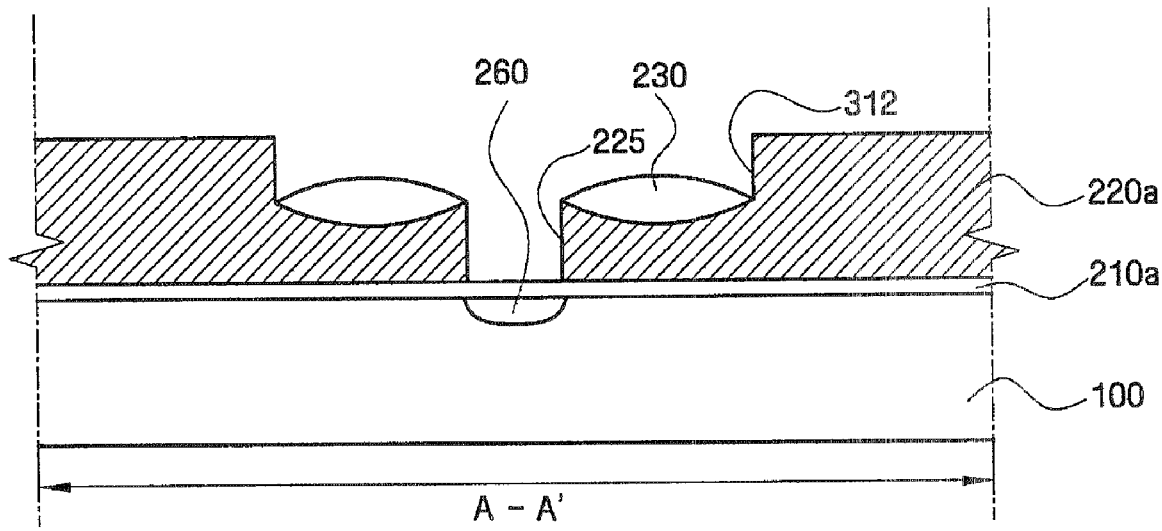

Next, referring to FIGS. 10 and 11, the blocking film 310 is removed.

That is, the blocking film 310 formed on the poly-silicon pattern 220a and the blocking film 310 buried in the first opening 225 is removed. The blocking film 310 may be removed by a wet etching process, for example, a phosphoric-acid strip process.

If the blocking film 310 buried in the first opening 225 is removed, the poly-silicon pattern 220a is divided into two parts. At this time, since the side profiles of the poly-silicon pattern 220a opposite to each other are the same as the side profile of the first opening 225, the curvature thereof is small.

Figure 12A:
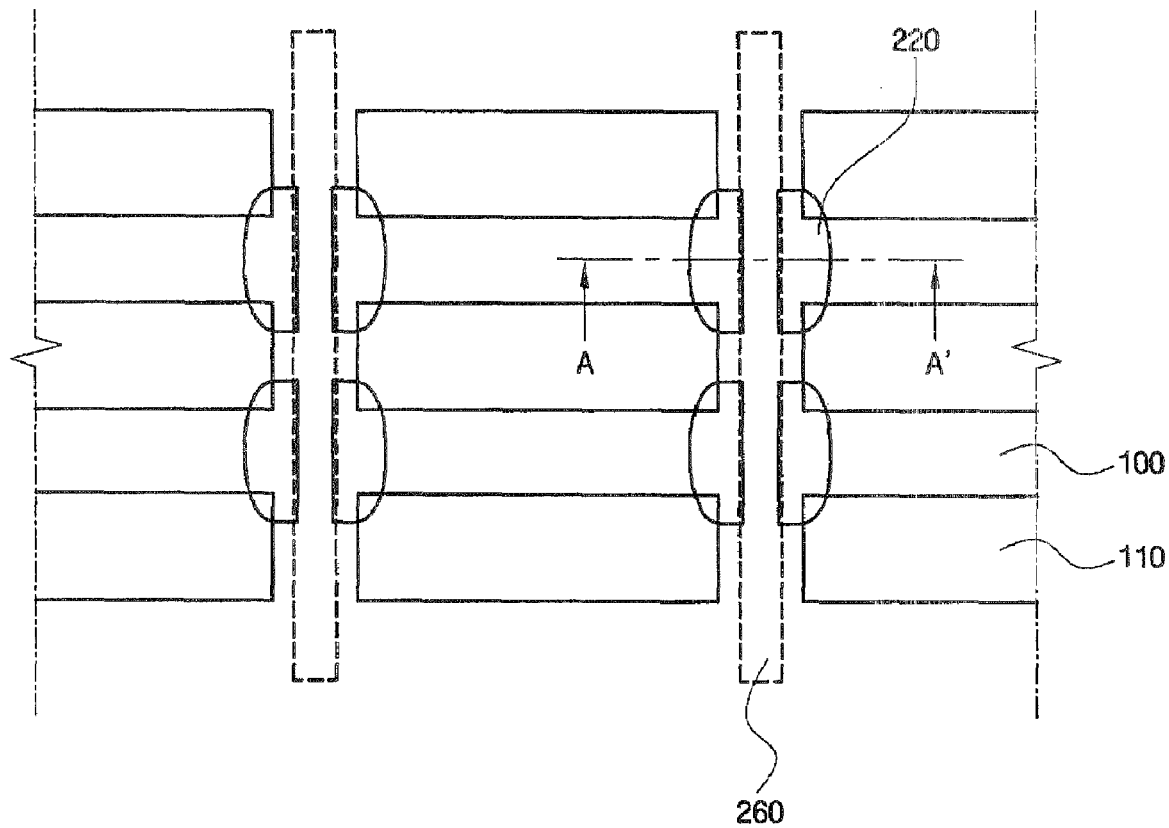
Figure 12B:
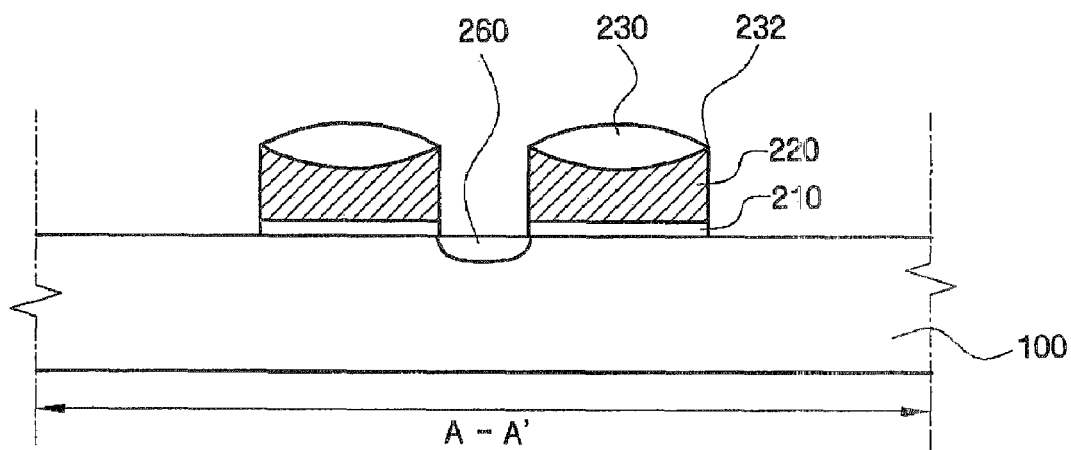

As shown in FIGS. 12A and 12B, the poly-silicon pattern 220a shown in FIGS. 10 and 11 is etched by using two inter-gate insulating films 230 as the etching mask, thereby forming two floating gates 220. At this time, for example, a dry etching method may be used.

When forming the floating gate 220 by etching the poly-silicon pattern 220a, the poly-silicon opposite to the surface adjacent the common source region 260 in the poly-silicon pattern 220a is removed. At this time, while the poly-silicon is removed, the opposite edge of the surface adjacent to the common source region 260 becomes round. Accordingly, the side profile of the floating gate 220 opposite to the common source region 260 has a predetermined curvature.

According to a method of fabricating a nonvolatile memory device according to an exemplary embodiment of the present invention, the two floating gates 220 are patterned by one pattern. The reason is that the two floating gates 220 are divided by the first opening 225. As the memory device becomes more integrated, it becomes important to accurately pattern a small pattern. Accordingly, the fabrication of the integrated memory device is further facilitated by patterning the two floating gates 220 at the same time.

Next, referring back to FIGS. 1A and 1B, the nonvolatile memory device is achieved by forming the control gate 250 on the floating gate 220 and forming the drain region 270 at one side of the control gate.

More specifically, the tunneling insulating film and the control gate conductive film are sequentially formed on the substrate tool. Here, the tunneling insulating film may be formed of the oxidation film having a thickness of about 70 to 150 Å by the thermal oxidation process. The tunnel insulating film includes a single or stacked structure of, for example, a nitride film, an oxynitride film, and a high-k material. Furthermore, a single thin film such as MTO, a multilayer thin film such as a thermal oxidation film/MTO or a thermal oxidation film/SiON/MTO, or an insulating film on which the multilayer thin film is deposited and then treated by $N_2O$-annealing is used as the tunnel insulating film.

In addition, the control gate conductive film may be formed to the thickness of about 1000 to 3000 Å by a LPCVD (Low Pressure Chemical Vapor Deposition) process. Here, the poly-silicon or the metal conductive film into which the poly-silicon or the impurity may be ion-injected is used as the control gate conductive film. The materials consisting of TaN, NiTa, Ti, TiN, Ta, W, WN, Hf, Nb, Mo, $RuO_2$, $Mo_2N$, Ir, Pt, Co, Cr, RuO, $Mo_2N$, WNx, and combination thereof are used as the metal conductive film. Furthermore, the stacked film of the poly-silicon and the silicide may be used as the control gate conductive film. An antireflection film (ARL) may be additionally stacked on the silicide.

The control gate 250 and the tunneling insulating film 240 are formed by etching the control gate conductive film and the tunneling insulating film by using the etching mask (not shown), so as to extend from the upper part of the floating gate 220 toward the substrate 100 along the side wall of the floating gate 220.

Next, a heat treatment process may be performed. In the case of performing the heat treatment process, the common source region 260 is expanded and overlaps a portion of the floating gate 220. In this exemplary embodiment, the heat treatment process may be added to any stage of the above described processes. Meanwhile, according to the method of fabricating the nonvolatile memory device according to an exemplary embodiment of the present invention, since the common source region 260 is formed prior to the step of forming the nonvolatile memory device, the common source region may be expanded by heat applied to the respective processes of forming the nonvolatile memory device, even though the heat treatment process is not separately performed.

The drain region 270 is formed in the substrate 100 so as to be aligned on one side of the control gate 250 by ion-injecting the high dose impurity. At this time, in the case where the nonvolatile memory device to be formed is an N-type impurity. The N-type impurity includes, for example, phosphorus (P) or arsenic (As). Meanwhile, in a case where the nonvolatile memory device to be formed is a P-type transistor, the common source region 260 is formed y injecting the P-type impurity. The P-type impurity includes, for example, boron (B), boron fluoride ($BF_2$, $BF_3$), or indium (In). The drain region 270 may be also expanded below the control gate 250 through the subsequent heat treatment.

Next, after stacking the interlayer insulating film on the entire surface and smoothening, a bit line contact hole is formed. In addition, a bit line contact and a bit line are formed on the bit line contact hole by stacking and patterning the conductive film, such as metal. Accordingly, as described above, the typical processes are further performed.

In the method of fabricating the nonvolatile memory device according to an exemplary embodiment of the present invention, the first ion injection process of forming the common source region 260 is performed prior to the step of forming the nonvolatile memory device. Accordingly, it is possible to prevent the characteristics and the reliability of memory cells from being deteriorated owing to the damage of the nonvolatile memory device 200 caused by the ion injection process that is performed by a high voltage.

That is, the nonvolatile memory device according to an exemplary embodiment of the present invention may form the nonvolatile memory device 200 of which the reliability is further improved, since the first ion injection process of forming the common source region 260 is performed at the initial step of the fabricating process of the nonvolatile memory device 200, that is, prior to the formation of the control gate 250, the floating gate 220 and the inter-gate insulating film 210.

In addition, according to a method of fabricating a nonvolatile memory device according to an exemplary embodiment of the present invention, the two floating gates 220 are patterned by one pattern. The reason is that the two floating gates 220 are divided by the first opening 225. Accordingly, it is easier to form the floating gate pattern by one pattern than to form the floating gate pattern by separately patterning each of the two floating gates 220. That is, since the smaller memory device is further accurately formed, it is possible to fabricate the smaller memory device and the high-integrated memory device.

Although the present invention has been described in connection with the exemplary embodiments of the present invention, it will be apparent to those skilled in the art that various modifications and changes may be made thereto without departing from the scope and spirit of the invention. Therefore, it should be understood that the above exemplary embodiments are not limitative, but illustrative in all aspects.

According to the above mentioned nonvolatile memory device and the method of fabricating the same, at least one of the following effects may be obtained.

First, since the damage of the nonvolatile memory device caused by the ion injection for forming the source region is reduced, the reliability of the nonvolatile memory device may be improved.

Second, since the small floating gate is patterned with accuracy, the more integrated nonvolatile memory device may be more easily fabricated.

Third, since the curvature of the lateral-side profile of the floating gate overlapping the source region gradually becomes small, a uniform electric field is formed. Therefore, the nonvolatile memory device may operate with more stability.

Fourth, since the area of the overlap portion between the floating gate and the source region becomes wider, the value of the capacitance generated between the floating gate and the source region increases. Accordingly, a coupling ratio may increase.

What is claimed is:

1. A nonvolatile memory device comprising:
a semiconductor substrate;
a source region that is formed in the semiconductor substrate;
a gate insulating film that is formed so as to partially overlap the source region on the semiconductor substrate;
a floating gate that is formed on the gate insulating film so as to have a first side edge that is substantially straight so as to form a portion of uniform width overlap the source region and having a second side opposite the first side that has a convex curvature, whereby a uniform electric field is formed in the portion that overlaps the source region;
a control gate that is formed so as to be electrically isolated along one side of the floating gate from an upper part of the floating gate;
an inter-gate insulating film that is interposed between the floating gate and the control gate; and
a drain region that is formed so as to be adjacent the other side of the control gate.

2. The nonvolatile memory device of claim 1, wherein a thickness of the inter-gate insulating film gradually becomes thinner from a center toward both ends.

3. A nonvolatile memory device comprising:
a semiconductor substrate;
a common source region that is formed in the semiconductor substrate;
first and second gate insulating films that are formed on both sides of the common source region so as to partially overlap the common source region;
first and second floating gates that are formed on the first and second gate insulating films, respectively, wherein each of the first and second floating gates has a first side edge that is substantially straight so as to form respective portions of uniform width overlapping the common source region and each having a second side opposite the first side that has a convex curvature, whereby a uniform electric field is formed in the floating gate portions overlapping the common source region;
first and second control gates that are formed so as to be electrically isolated along the other side of the floating gate from an upper part of the first and second floating gates toward a direction opposite to the common source region, respectively;
first and second inter-gate insulating films that are formed on the first and second floating gates and interposed between the first and second floating gates and the first and second control gates; and
first and second drain regions that are formed so as to be adjacent the other side of the first and second control gates, respectively.

4. The nonvolatile memory device of claim 3, wherein a thickness of each of the first and second inter-gate insulating films gradually becomes thinner from a center toward both ends.

* * * * *